United States Patent [19]
Rieger

[11] Patent Number: 6,094,398
[45] Date of Patent: Jul. 25, 2000

[54] DRAM INCLUDING AN ADDRESS SPACE DIVIDED INTO INDIVIDUAL BLOCKS HAVING MEMORY CELLS ACTIVATED BY ROW ADDRESS SIGNALS

[75] Inventor: Johann Rieger, Bad Abbach, Germany

[73] Assignee: Siemens Aktiengesellschaft, Munich, Germany

[21] Appl. No.: 09/281,694

[22] Filed: Mar. 30, 1999

Related U.S. Application Data

[63] Continuation of application No. PCT/DE97/02233, Sep. 29, 1997.

[30] Foreign Application Priority Data

Sep. 30, 1996 [DE] Germany .............. 196 40 419

[51] Int. Cl.⁷ ............................................. G11C 8/00
[52] U.S. Cl. ...................... 365/230.03; 365/230.01
[58] Field of Search .................... 365/230.03, 230.01, 365/189.04

[56] References Cited

U.S. PATENT DOCUMENTS

| | | | |
|---|---|---|---|
| 5,511,030 | 4/1996 | Tanaka et al. | 365/230.03 |
| 5,528,552 | 6/1996 | Kamisaki | 365/230.03 |

*Primary Examiner*—Richard Elms
*Assistant Examiner*—Anh Phung
*Attorney, Agent, or Firm*—Herbert L. Lerner; Laurence A. Greenberg; Werner H. Stemer

[57] ABSTRACT

A DRAM with an address space divided into blocks, in which storage cells of individual blocks can be activated by a row address signal (RAS) furnished by a controller. Each individual block can then be activated by an independent activation signal derived from the row address signal. The activation signals for different blocks are supplied to the different blocks in succession with a partial time overlap, so that the obtained data rate is increased relative to activation of only one block, owing to partial time activation of at least two different blocks.

5 Claims, 4 Drawing Sheets

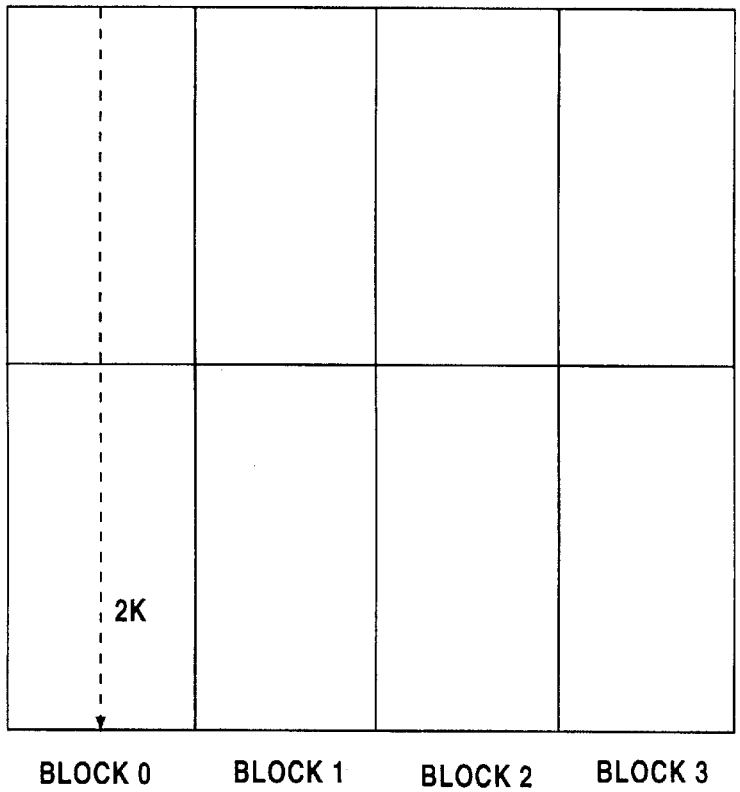
Fig.1
PRIOR ART
2K
BLOCK 0  BLOCK 1  BLOCK 2  BLOCK 3
Fig.2
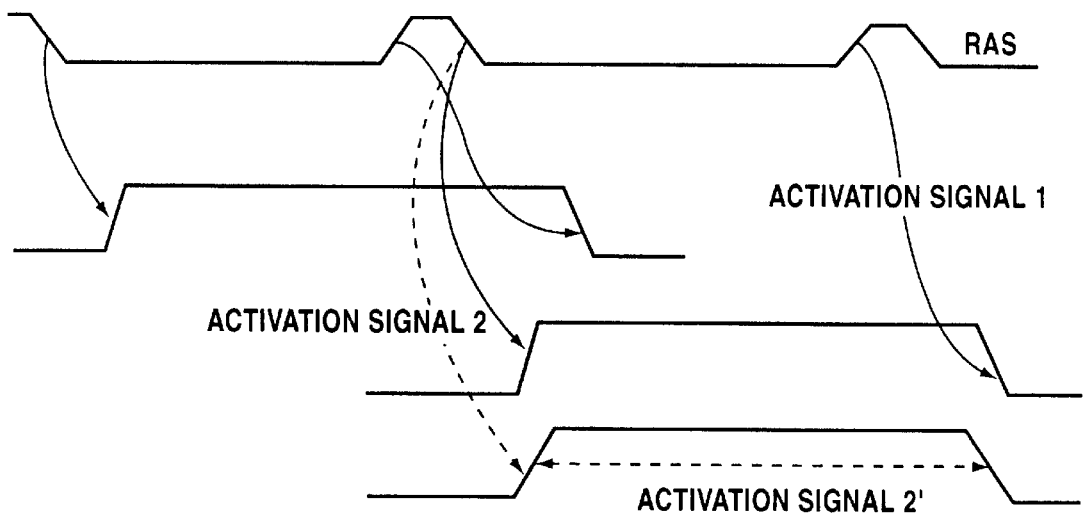

DRAM INCLUDING AN ADDRESS SPACE DIVIDED INTO INDIVIDUAL BLOCKS HAVING MEMORY CELLS ACTIVATED BY ROW ADDRESS SIGNALS

CROSS-REFERENCE TO RELATED APPLICATION

This is a continuation of copending International Application PCT/DE97/02233, filed Sep. 29, 1997, which designated the United States.

BACKGROUND OF THE INVENTION

1. Field of the Invention

The invention concerns a dynamic random-access memory (DRAM) with an address space divided into blocks, in which memory cells of individual blocks can be activated by a row address signal (RAS) delivered by a controller.

The address space of DRAMs are known to be divided into several blocks that are disposed physically in a row next to each other and logically in two rows next to each other. Viewed logically, two superimposed blocks of the two rows then form a single block. However, the access time for accessing data in the memory blocks is time consuming.

2. Summary of the Invention

It is accordingly an object of the invention to provide a DRAM that overcomes the above-mentioned disadvantages of the prior art devices of this general type, having a particularly short cycle time and thus permitting even more rapid data access.

With the foregoing and other objects in view there is provided, in accordance with the invention, a dynamic random-access memory (DRAM) having an address space divided into blocks, including: memory blocks having storage cells; a controller furnishing a row addressing signal (RAS); the memory blocks activated by activation signals derived from the row address signal and each of the memory blocks having an independent activation signal; and the activation signals for different memory blocks supplied in succession to the different memory blocks in a partial time overlap, so that an obtained data rate is increased as a result of partial simultaneous activation of at least two of the different memory blocks relative to an activation of only one memory block.

The task is solved in a DRAM according to the invention of the type mentioned at the outset, in that each individual block can be activated by an independent activation signal derived from the RAS signal. The activation signals for different blocks are supplied in succession in partial time overlap to the different blocks, so that the obtained data rate, as a result of partially simultaneous activation of at least two different blocks, is increased relative to the activation of only one block.

In the DRAM according to the invention, which, as further explained below, has a cycle time of about 60 ns and therefore is also referred to as a fast RAS cycle (FRC) DRAM one or more of the unactivated blocks can be activated before the activity of at least one previously selected block is completed. The cycle time of the RAS signal can thus be significantly shortened and reduced to about half. The shortening of cycle time is achieved, in particular, by a shorter precharging time in the RAS cycle.

If the ordinary longer precharging time is considered again, one can convert without difficulty from a normal mode of the existing DRAM to the FRC mode of the DRAM according to the invention. A "jump" between the normal mode and the FRC mode is therefore possible without a time loss.

Whereas, as explained above, an address restriction to 0.05% of the total address space is present in the FPM operation, the restriction is significantly lower in the FRC DRAM according to the invention: successive X addresses in the FRC DRAM according to the invention may not lie in the same storage block. Therefore, in a 4 M DRAM, after an X address that lies, say, in block 0, blocks 1 to 3 are available (compare FIG. 1), which means that 75% of the address space is freely available. In a 16 M DRAM this percentage of freely available addresses is even greater.

In the DRAM according to the invention the activation signals for the individual blocks are generated independently of each other. This can occur, for example, by deriving the beginning and end of an activation signal from the RAS signal. However, it is also possible to derive only the beginning of the activation signal from the RAS signal and then adjust the end of the activation signal by an internal timer. The restore timing is generated in the individual storage blocks, i.e., for these blocks individually, and not centrally, as previously done.

The same applies to the drive voltage and the decoder voltage of the word lines.

When a DRAM according to the invention has 4 independent blocks, i.e., a 4 M DRAM is present, a lower value X address can be used for block selection. The probability that two consecutive addresses lie in the same block can then be substantially reduced. Under practical conditions, a large number of addresses are accessed sequentially anyway, so that the addresses of the same block can scarcely occur in succession.

When the controller uses two different timings, which operate depending on the distance from the last access address, it is possible without difficulty for access to the same block to occur not in succession. The same can also be achieved by corresponding storage of an additional bit.

The DRAM according to the invention permits a cycle time gain in 4 blocks of about 55% of the cycle time of a normal DRAM during sequential access, 67% of the cycle time of a normal DRAM during statistical access and about 60% of the cycle time of a normal DRAM during practical use.

Since the activation signals in the DRAM according to the invention are derived from the RAS signal, a CAS-before-RAS mode is not possible.

Other features which are considered as characteristic for the invention are set forth in the appended claims.

Although the invention is illustrated and described herein as embodied in a DRAM, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic scheme for a logic address space of a 4 M DRAM according to the prior art;

FIG. 2 is a timing diagram of a trend of activation signals 1 and 2 in the DRAM according to the invention;

DESCRIPTION OF THE PREFERRED EMBODIMENTS

Figure 3:
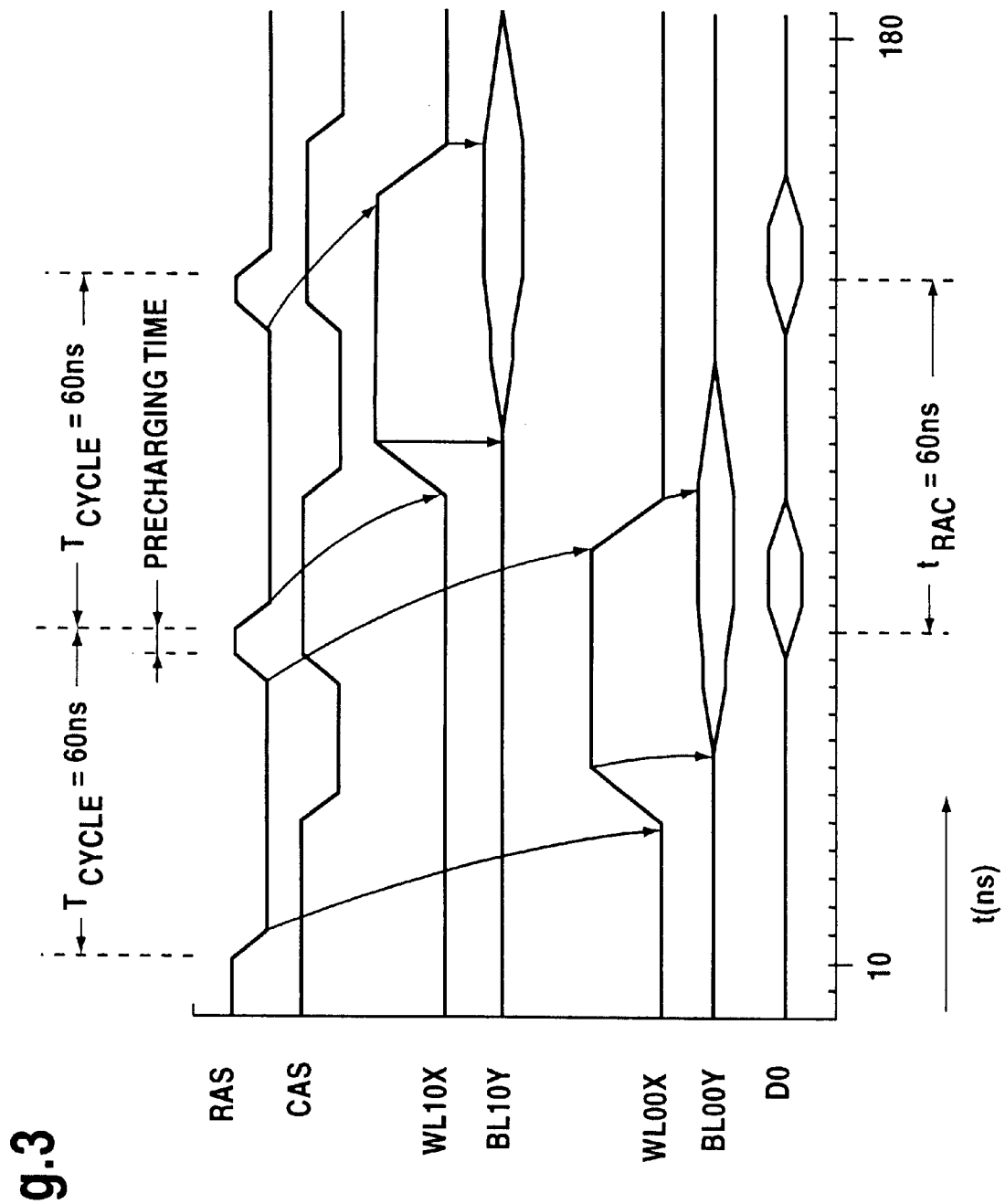
FIG. 3 is a timing diagram of different signals in the DRAM.

In all the figures of the drawing, sub-features and integral parts that correspond to one another bear the same reference symbol in each case. Referring now to the figures of the drawing in detail and first, particularly, to FIG. 1 thereof, there is shown four blocks of a prior art DRAM. A DRAM with a storage capacity of 4 megabit (4 M DRAM) has 4 blocks, whereas a 16 M DRAM has eight blocks. FIG. 1 is referred to here, in which a logic address space is shown with 4 blocks, 0, 1, 2, 3.

In this type of DRAM a row address signal (RAS) cycle consists of addressing the individual lines, evaluation of the internal data of the corresponding storage cells and lasts till the "equalization" of a bit line. The RAS cycle is only ended when the cycle of the corresponding activated block is completed.

Figure 4:
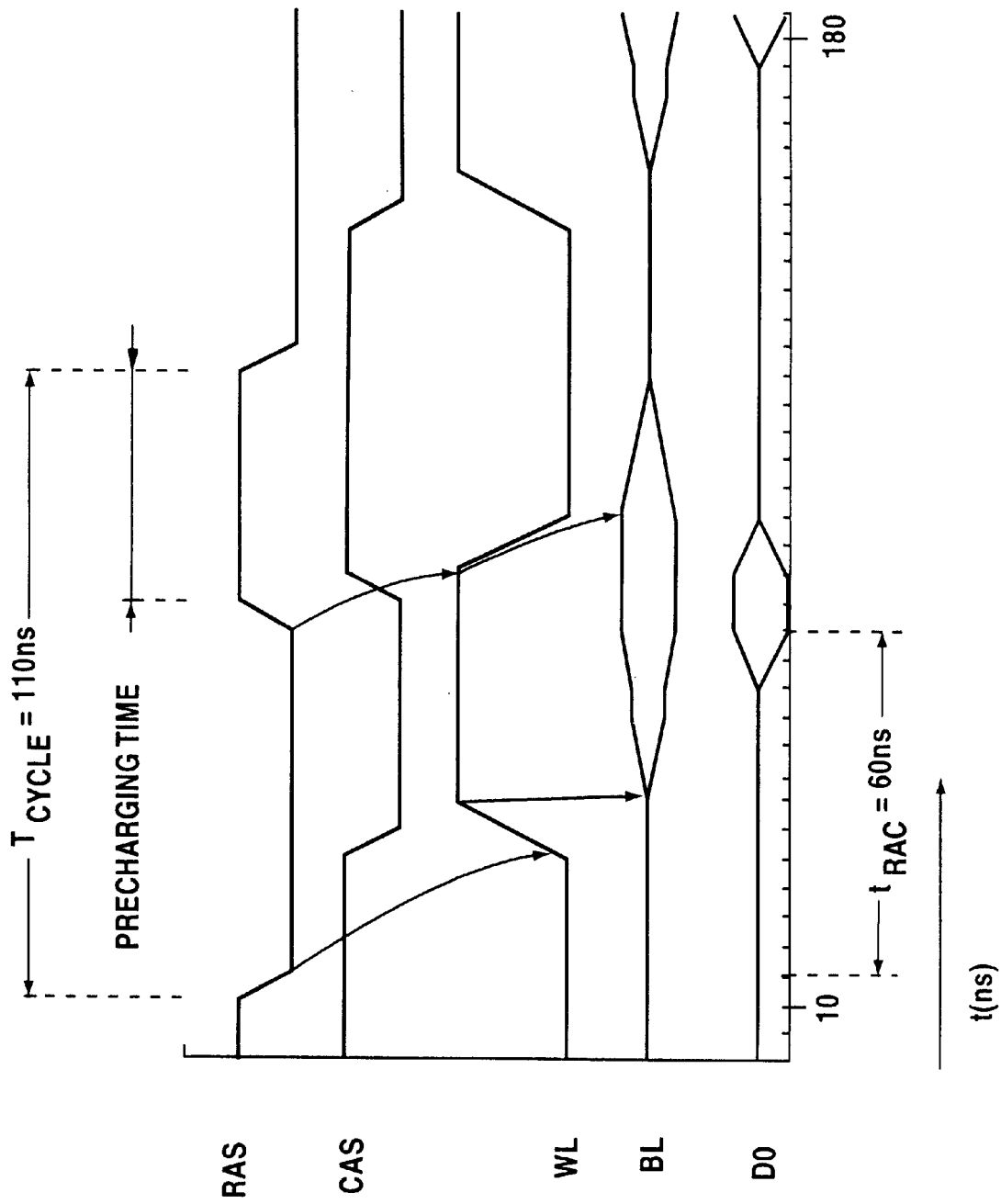
FIG. 4 is a timing diagram of different signals in a prior art DRAM.

This is shown in detail in FIG. 4, at the top of which the RAS delivered by a controller is shown. A word line signal WL is derived from the RAS, from which a bit line signal BL is again recovered, as indicated by the corresponding arrows. CAS denotes a column address signal, whereas DO indicates the obtained data output. As is now apparent from FIG. 4, a cycle time $T_{cycle}$ of the RAS consists, in particular, of an access time $t_{RAC}$ and a precharging time. The access time $t_{RAC}$ amounts to 60 ns, for example, whereas a typical value of 110 ns is given for the cycle time $T_{cycle}$.

Shortening of the cycle time $T_{cycle}$ is desirable as this allows a more rapid readout of the DRAM. For example, a fast page mode (FPM) operation permits more rapid access. FPM operation, however, is restricted to one page, namely, columns of a logic block (compare the dashed arrow in FIG. 1), and therefore is only 0.05% of the total address space in a 4 M DRAM, namely, 2 kbit of the 4 Mbit.

It should be noted that FIG. 1 shows the logic address space in an existing DRAM and in the DRAM according to the invention.

Figure 5:
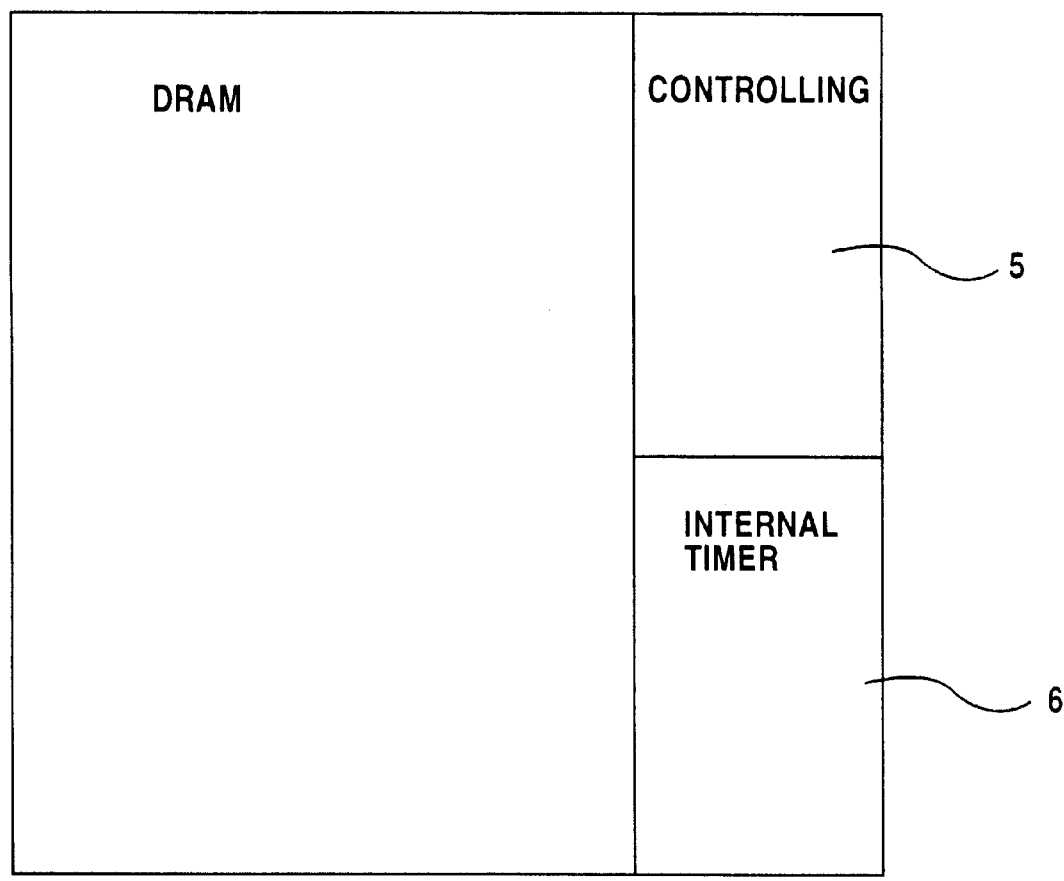
FIG. 5 is a diagrammatic block diagram of the DRAM according to the invention.

As is shown in FIG. 2, activation signals 1 and 2 are derived from the RAS signal, in which a beginning and an end of the activation signals 1 and 2 are derived from pulses of the RAS signal. As an alternative, as already explained above, however, only the beginning of the activation signal 1, 2 can also be derived from the RAS signal, whereas the end of the activation signal 1, 2 is determined by an internal timer 5 of the DRAM. This is shown in FIG. 2 for an activation signal 2' by dashed arrows and in FIG. 5.

FIG. 3 shows a specific example for a signal trend in the 4 M DRAM. The RAS signal from a controller 6 (see FIG. 5) here has the cycle time $T_{cycle}$ of 60 ns, only 5 ns of which pertains to the precharging time. The access time $t_{RAS}$, as in the existing DRAM, also equals 60 ns (see FIG. 4 for this purpose).

In the example of FIG. 3 two signals WL10X and WL00X are derived from the RAS signal as activation signals for word lines, from which bit line signals BL10Y and BL00Y are again derived. The bit line signals BL10Y and BL00Y overlap partially, which ultimately leads to a higher data rate at the data output DO (compare FIG. 3 with FIG. 4).

Block-wise activation with independent block activation signals that are generated from the RAS from the controller in the DRAM is therefore essential to the invention. Because of this, a subsequent block can be activated before the present block is deactivated.

Whereas two activation signals overlap each other in the practical example of FIGS. 2 and 3, it is also possible for overlapping of three activation signals to occur. It need only be ensured that the activation signals are supplied in time succession from different blocks.

I claim:

1. A dynamic random-access memory (DRAM) having an address space divided into blocks, comprising:

memory blocks having storage cells;

a controller furnishing a row address signal (RAS) having pulses;

said memory blocks activated by activation signals having respective beginnings and ends, said activation signals being derived from said row address signal and each of said memory blocks having an independent activation signal; and said activation signals for different memory blocks supplied in succession to said different memory blocks in a partial time overlap obtained by deriving the respective beginnings and ends of said activation signals from the pulses of said row address signal, so that an obtained data rate is increased as a result of partial simultaneous activation of at least two of said different memory blocks relative to an activation of only one memory block.

2. The DRAM according to claim 1, wherein said activation signals have a duration derived from said row address signal.

3. The DRAM according to claim 1, wherein said activation signals have a duration and including an internal timer for furnishing said duration of said activation signals.

4. The DRAM according to claim 1, wherein said row address signal has a pulse duration and a precharging time duration much shorter than said pulse duration.

5. A dynamic random-access memory (DRAM) having an address space divided into blocks, comprising:

memory blocks having storage cells;

a controller furnishing a row address signal (RAS) having pulses;

said memory blocks activated by activation signals each having a respective beginning and duration, said activation signals being derived from said row address signal and each of said memory blocks having an independent activation signal;

said activation signals for different memory blocks supplied in succession to said different memory blocks in a partial time overlap obtained by deriving the respective beginning of said activation signals from the pulses of said row address signal, so that an obtained data rate is increased as a result of partial simultaneous activation of at least two of said different memory blocks relative to an activation of only one memory block; and an internal timer determining the respective duration of said activation signals.

* * * * *